(12) United States Patent
Mikoshiba et al.

(10) Patent No.: US 10,926,538 B2
(45) Date of Patent: Feb. 23, 2021

(54) LIQUID EJECTING HEAD AND LIQUID EJECTING APPARATUS

(71) Applicant: SEIKO EPSON CORPORATION, Tokyo (JP)

(72) Inventors: Masanori Mikoshiba, Shimosuwa-machi (JP); Shiro Yazaki, Chino (JP); Toshinao Shinbo, Matsumoto (JP); Hitoshi Takaai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/717,643

(22) Filed: Dec. 17, 2019

(65) Prior Publication Data

US 2020/0198351 A1 Jun. 25, 2020

(30) Foreign Application Priority Data

Dec. 20, 2018 (JP) .............................. JP2018-238102

(51) Int. Cl.
*B41J 2/14* (2006.01)
*H05K 3/36* (2006.01)
*B41J 2/01* (2006.01)

(52) U.S. Cl.
CPC .......... *B41J 2/14233* (2013.01); *H05K 3/361* (2013.01); *B41J 2/01* (2013.01); *B41J 2002/14258* (2013.01); *B41J 2002/14362* (2013.01); *B41J 2002/14419* (2013.01); *B41J 2002/14491* (2013.01); *B41J 2202/12* (2013.01)

(58) Field of Classification Search
CPC .......... B41J 2/14233; B41J 2002/14491; B41J 2202/12; B41J 2002/14362; B41J 2002/14419; B41J 2/01; B41J 2002/14258; H05K 3/361
See application file for complete search history.

(56) References Cited

U.S. PATENT DOCUMENTS

| | | | |
|---|---|---|---|
| 6,447,106 B1* | 9/2002 | Watanabe | B41J 2/14233 347/70 |
| 6,505,919 B1* | 1/2003 | Mizutani | B41J 2/14233 310/330 |
| 2002/0080213 A1* | 6/2002 | Shimada | B41J 2/14233 347/68 |
| 2015/0116400 A1* | 4/2015 | Sasaki | B41J 2/04596 347/10 |
| 2018/0226560 A1* | 8/2018 | Yonemura | B41J 2/1632 |

FOREIGN PATENT DOCUMENTS

JP 2004034417 2/2004

* cited by examiner

*Primary Examiner* — Yaovi M Ameh
(74) *Attorney, Agent, or Firm* — Workman Nydegger

(57) ABSTRACT

A liquid ejecting head including a diaphragm constituting a portion of a wall surface of a pressure chamber that accommodates a liquid, and a piezoelectric element that vibrates the diaphragm. In the liquid ejecting head, the diaphragm includes a plurality of layers, and d/D≤0.25 is satisfied where D is a thickness of the diaphragm and d is a distance between a neutral axis of the diaphragm and an interface between two adjacent layers in which a tension difference is the largest in the plurality of layers.

16 Claims, 8 Drawing Sheets

LIQUID EJECTING HEAD AND LIQUID EJECTING APPARATUS

The present application is based on, and claims priority from JP Application Serial Number 2018-238102, filed Dec. 20, 2018, the disclosure of which is hereby incorporated by reference herein in its entirety.

BACKGROUND

1. Technical Field

The present disclosure relates to a liquid ejecting head and a liquid ejecting apparatus.

2. Related Art

A liquid ejecting head that ejects a liquid inside pressure chambers from nozzles by vibrating a diaphragm with piezoelectric elements is known. The diaphragm constitutes a portion of a wall surface of each pressure chamber. For example, in a liquid ejecting head described in JP-A-2004-034417, an elastic film, an insulating film, a lower electrode, a piezoelectric layer, and an upper electrode are layered in the above order. The lower electrode, the piezoelectric layer, and the upper electrode constitute a piezoelectric element. The elastic film, the insulating film, and the lower electrode act as a diaphragm. The elastic film is a compressive film formed of silicon dioxide. The insulating film is a tensile film formed of zirconium dioxide. The lower electrode is a tensile film formed of platinum.

In known liquid ejecting heads, there is an issue, in that when distortion occurs in interfaces of a plurality of layers constituting a diaphragm, cracking tends to occur in a portion of the diaphragm where there is no piezoelectric layers due to flexing and deformation of the diaphragm. In particular, in the diaphragm such as the one in JP-A-2004-034417 in which the diaphragm includes at least one compressive film and at least one tensile film, damage such as cracking tends to occur.

SUMMARY

An aspect of a liquid ejecting head according to the present disclosure includes a diaphragm constituting a portion of a wall surface of a pressure chamber that accommodates a liquid, and a piezoelectric element that vibrates the diaphragm. In the liquid ejecting head, the piezoelectric element is provided so as to cover only a portion of the diaphragm opposing the pressure chamber, the diaphragm includes a plurality of layers, and $d/D \leq 0.25$ is satisfied where D is a thickness of the diaphragm and d is a distance between a neutral axis of the diaphragm and an interface between two adjacent layers in which a tension difference is the largest in the plurality of layers.

An aspect of a liquid ejecting apparatus according to the present disclosure includes the liquid ejecting head according to the aspect described above.

DESCRIPTION OF EXEMPLARY EMBODIMENTS

1. Embodiment 1-1. Overall Configuration of Liquid Ejecting Apparatus

Figure 1:
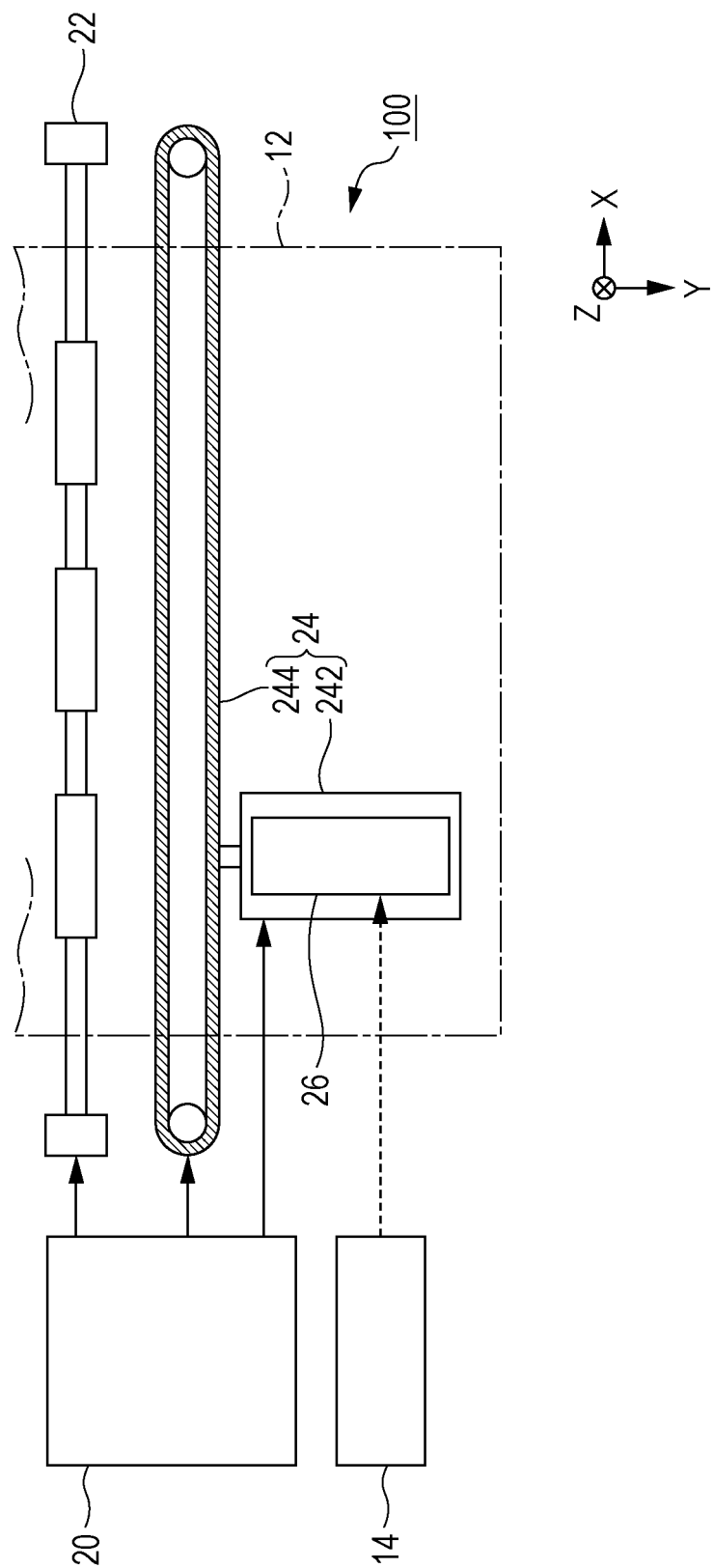
FIG. 1 is a block diagram schematically illustrating a liquid ejecting apparatus according to an embodiment.

FIG. 1 is a block diagram schematically illustrating a liquid ejecting apparatus 100 according to the present embodiment. The liquid ejecting apparatus 100 is an ink jet printing apparatus that ejects ink, which is an example of a liquid, on a medium 12. While the medium 12 is typically printing paper, an object to be printed formed of any material, such as a resin film or fabric, is used as the medium 12. As illustrated as an example in FIG. 1, a liquid container 14 that stores ink is installed in the liquid ejecting apparatus 100. For example, a cartridge configured to detach from the liquid ejecting apparatus 100, a bag-shaped ink pack formed of flexible film, or an ink tank into which ink can be refilled is used as the liquid container 14. A plurality of types of inks of different colors are stored in the liquid container 14.

As illustrated as an example in FIG. 1, the liquid ejecting apparatus 100 includes a control unit 20, a transport mechanism 22, a moving mechanism 24, and a liquid ejecting head 26. The control unit 20 includes a processing circuit such as a central processing unit (CPU) or a field programmable gate array (FPGA) and a memory circuit such as a semiconductor memory, and controls each element of the liquid ejecting apparatus 100 in an integrated manner. The transport mechanism 22 transports the medium 12 in a Y direction under the control of the control unit 20.

The moving mechanism 24 reciprocates the liquid ejecting head 26 in an X direction under the control of the control unit 20. The X direction is a direction orthogonal to the Y direction in which the medium 12 is transported. The moving mechanism 24 of the present embodiment includes a substantially box-shaped transport body 242, referred to as a carriage, that houses the liquid ejecting head 26, and a transport belt 244 to which the transport body 242 is fixed. Note that a configuration in which a plurality of liquid ejecting heads 26 are mounted in the transport body 242 or a configuration in which the liquid container 14 is mounted in the transport body 242 together with the liquid ejecting head 26 can be adopted.

The liquid ejecting head 26 ejects ink, which is supplied from the liquid container 14, to the medium 12 through a plurality of nozzles under the control of the control unit 20. Concurrently with the transportation of the medium 12 performed with the transport mechanism 22 and the repetitive reciprocation of the transport body 242, the liquid ejecting head 26 ejects ink onto the medium 12 to form a desired image on a surface of the medium 12. Note that a direction perpendicular to an XY plane is hereinafter referred to as a Z direction. The direction in which the ink is ejected by the liquid ejecting head 26 corresponds to the Z direction. The XY plane is, for example, a plane parallel to the surface of the medium 12.

1-2. Overall Configuration of Liquid Ejecting Head

Figure 2:
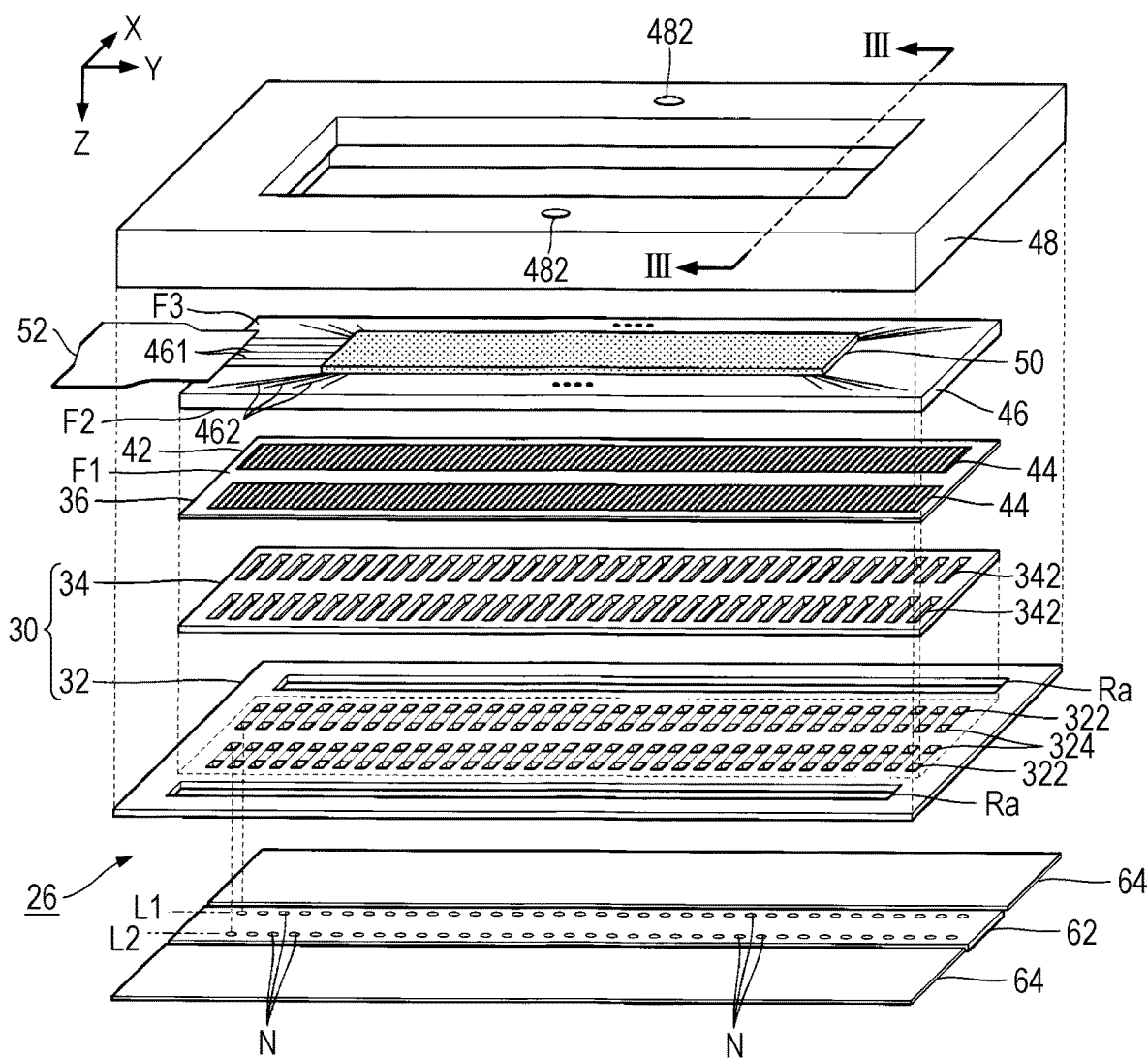
FIG. 2 is an exploded perspective view of a liquid ejecting head according to the embodiment.
Figure 3:
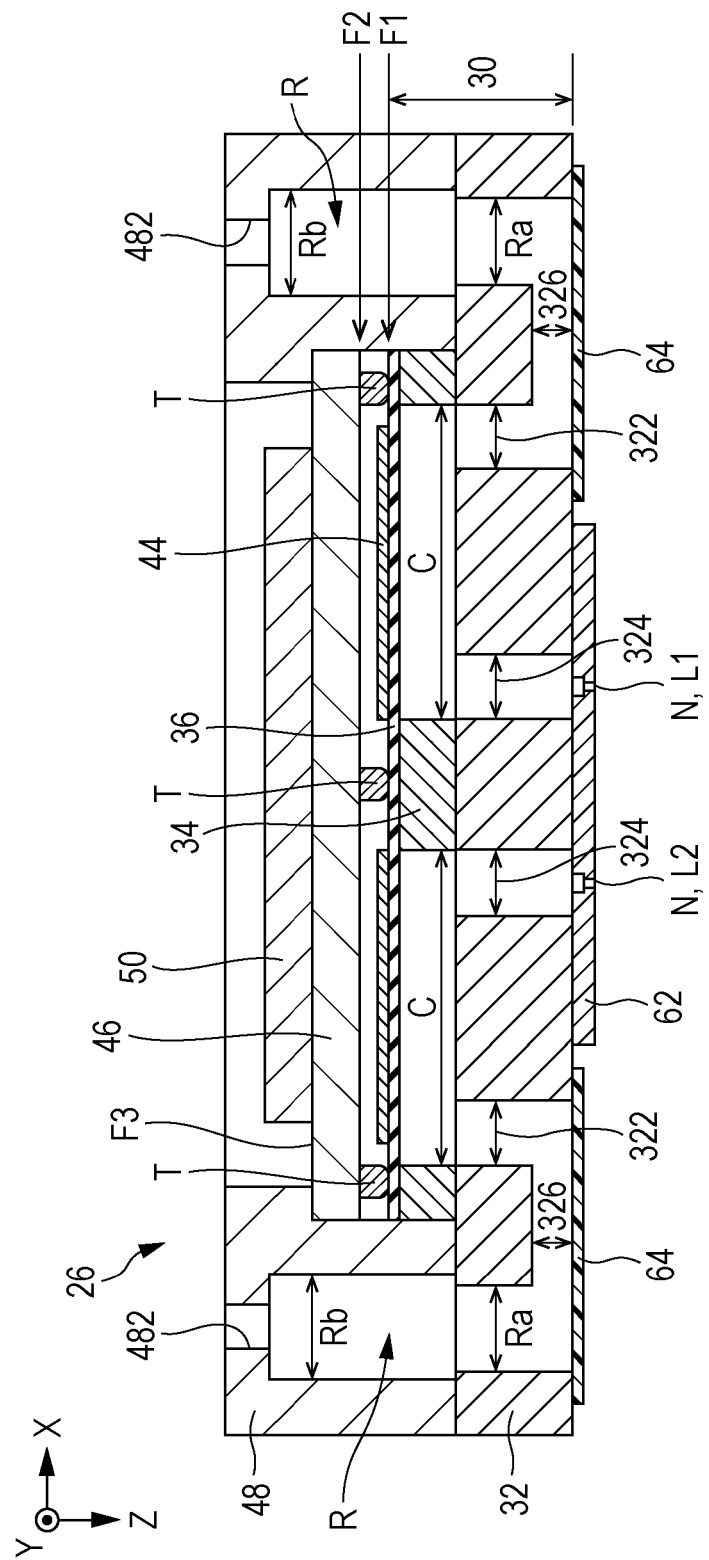
FIG. 3 is a cross-sectional view taken along line III-III in FIG. 2.

FIG. 2 is an exploded perspective view of the liquid ejecting head 26 according to the present embodiment. FIG. 3 is a cross-sectional view taken along line III-III in FIG. 2. As illustrated as an example in FIG. 2, the liquid ejecting head 26 includes a plurality of nozzles N arranged in the Y direction, which is an example of a first direction. The plurality of nozzles N of the embodiment are divided into a first line L1 and a second line L2 that are parallelly arranged with a space in between in the X direction, which is an example of a second direction. The first line L1 and the second line L2 are each a set of a plurality of nozzles N linearly arranged in the Y direction. Note that while the positions of the nozzles N of the first line L1 and those of the second line L2 in the Y direction can be different from each other, in other words, arranged in a zigzag manner or arranged in a staggered manner, for the sake of convenience, a configuration in which the positions of the nozzles N of the first line L1 and those of the second line L2 in the Y direction are set to coincide each other is described below as an example. As it can be understood from FIG. 3, the liquid ejecting head 26 of the present embodiment is structured so that the elements related to each of the nozzles N in the first line L1 and the elements related to each of the nozzles N in the second line L2 are disposed in a substantially axisymmetric manner.

As illustrated as an example in FIGS. 2 and 3, the liquid ejecting head 26 includes a flow path forming unit 30. The flow path forming unit 30 is a structure that forms flow paths that supply ink to the plurality of nozzles N. The flow path forming unit 30 of the present embodiment is constituted by layers including a flow path substrate 32 and a pressure chamber substrate 34. The flow path substrate 32 and the pressure chamber substrate 34 are each a plate-shaped member elongated in the Y direction. The pressure chamber substrate 34 is fixed to a surface of the flow path substrate 32 on a negative side in the Z direction with, for example, an adhesive agent.

As illustrated as an example in FIG. 2, a diaphragm 36, a wiring substrate 46, a housing portion 48, and a drive circuit 50 are mounted in an area on the negative side in the Z direction with respect to the flow path forming unit 30. On the other hand, a nozzle plate 62 and a vibration absorber 64 are mounted in an area on the positive side in the Z direction with respect to the flow path forming unit 30. Generally, each element of the liquid ejecting head 26 is, similar to the flow path substrate 32 and the pressure chamber substrate 34, a plate-shaped member elongated in the Y direction and is bonded to each other using an adhesive agent, for example.

The nozzle plate 62 is a plate-shaped member in which a plurality of nozzles N are formed, and is mounted on a surface of the flow path substrate 32 on the positive side in the Z direction. Each of the plurality of nozzles N is a circular through hole through which ink passes. In the nozzle plate 62 of the present embodiment, the plurality of nozzles N constituting the first line L1 and the plurality of nozzles N constituting the second line L2 are formed. The nozzle plate 62 is fabricated by processing a single crystal substrate formed of silicon (Si) using a semiconductor manufacturing technique (for example, a processing technique such as dry etching or wet etching), for example. However, any known materials and any known manufacturing methods can be adopted to manufacture the nozzle plate 62.

As illustrated as an example in FIGS. 2 and 3, in the flow path substrate 32, a space Ra, a plurality of supply flow paths 322, a plurality of communication flow paths 324, and a supply liquid chamber 326 are formed for each of the first line L1 and the second line L2. Each space Ra is an elongated opening formed in the Y direction in plan view viewed in the Z direction, and the supply flow paths 322 and the communication flow paths 324 are each a through hole formed for a corresponding nozzle N. Each supply liquid chamber 326 is an elongated space formed in the Y direction and across a plurality of nozzles N, and communicates the space Ra and the plurality of supply flow paths 322 to each other. Each of the plurality of communication flow paths 324 overlaps a single nozzle N corresponding to a communication flow path 324 in plan view.

As illustrated as an example in FIGS. 2 and 3, the pressure chamber substrate 34 is a plate-shaped member in which a plurality of pressure chambers C, referred to as cavities, are formed in each of the first line L1 and the second line L2. The plurality of pressure chambers C are arranged in the Y direction. Each pressure chamber C is formed for each nozzle N and is a space elongated in the X direction in plan view. Similar to the nozzle plate 62 described above, the flow path substrate 32 and the pressure chamber substrate 34 are manufactured by processing a single crystal substrate formed of silicon using a semiconductor manufacturing technique, for example. However, any known materials and any known manufacturing methods can be adopted to manufacture the flow path substrate 32 and the pressure chamber substrate 34.

As understood from FIG. 2, the pressure chambers C are spaces located between the flow path substrate 32 and the diaphragm 36. A plurality of pressure chambers C are arranged in the Y direction in each of the first line L1 and the second line L2. As illustrated in FIGS. 2 and 3, the pressure chambers C are in communication with the communication flow paths 324 and the supply flow paths 322. Accordingly, the pressure chambers C are in communication with the nozzles N through the communication flow paths 324 and are in communication with the spaces Ra through the supply flow paths 322 and the supply liquid chamber 326.

The diaphragm 36 is provided on a surface of the pressure chamber substrate 34 on a side opposite the flow path substrate 32. The diaphragm 36 is a plate-shaped member configured to vibrate elastically. The diaphragm 36 will be described in detail later.

As illustrated as an example in FIGS. 2 and 3, a plurality of piezoelectric elements 44 each corresponding to a different nozzle N are formed for each of the first line L1 and the second line L2 and on a first surface F1 that is a surface of the diaphragm 36 on a side opposite the pressure chambers C. Each piezoelectric element 44 is a passive element that becomes deformed by a drive signal supplied thereto. Each piezoelectric element 44 has a shape elongated in the X direction in plan view. The plurality of piezoelectric elements 44 are arranged in the Y direction so as to correspond to the plurality of pressure chambers C. When the diaphragm 36 working together with the deformation of the piezoelectric elements 44 vibrates, the pressures inside the pressure chambers C change and the ink is ejected through the nozzles N. The piezoelectric elements 44 will be described in detail later.

The housing portion 48 is a case for storing the ink that is to be supplied to the plurality of pressure chambers C. As illustrated as an example in FIG. 3, in the housing portion 48 of the present embodiment, a space Rb is formed for each of the first line L1 and the second line L2. Each space Rb of the housing portion 48 and the corresponding space Ra of the flow path substrate 32 communicates with each other. The spaces defined by the spaces Ra and the spaces Rb function as liquid storage chambers (reservoirs) R that store the ink supplied to the plurality of pressure chambers C. Ink is supplied to the liquid storage chambers R through introduction openings 482 formed in the housing portion 48. The ink in the liquid storage chambers R is supplied to the pressure chambers C through the supply liquid chambers 326 and the supply flow paths 322. The vibration absorber 64 is a flexible film (a compliance substrate) constituting wall surfaces of the liquid storage chambers R and absorbs the pressure fluctuations of the ink inside the liquid storage chambers R.

The wiring substrate 46 is a plate-shaped member on which wiring that electrically couples the drive circuit 50 and the plurality of piezoelectric elements 44 to each other are formed. A second surface F2, which is a surface of the wiring substrate 46 on one side, is adhered to the first surface F1 of the diaphragm 36 in which the plurality of piezoelectric elements 44 are formed with a plurality of conductive bumps T in between. Accordingly, the first surface F1 and the second surface F2 opposing each other are spaced apart from each other. The drive circuit 50 is mounted on a third surface F3, which is a surface of the wiring substrate 46 on a side opposite the second surface F2. The drive circuit 50 is an integrated circuit (IC) chip that outputs the drive signal and a reference voltage that drive each piezoelectric element 44. As it can be understood from the above description, the wiring substrate 46 is mounted between the flow path forming unit 30 and the drive circuit and 50, and the plurality of piezoelectric elements 44 are located between the flow path forming unit 30 and the wiring substrate 46. The wiring substrate 46 of the present embodiment also functions as a reinforcing plate that reinforces the mechanical strength of the liquid ejecting head 26 and as a sealing plate that protects and seals the piezoelectric elements 44.

As illustrated as an example in FIG. 2, an end portion of an external wiring 52 is adhered to the third surface F3 of the wiring substrate 46. The external wiring 52 is configured of a connecting component such as a flexible printed circuit (FPC) or a flexible flat cable (FFC), for example. A plurality of wires 461 that electrically couple the external wiring 52 and drive circuit 50 to each other and a plurality of wires 462 to which the drive signal and the reference voltage output from the drive circuit 50 are supplied are formed on the third surface F3 of the wiring substrate 46.

1-3. Details of Diaphragm and Piezoelectric Element

Figure 4:
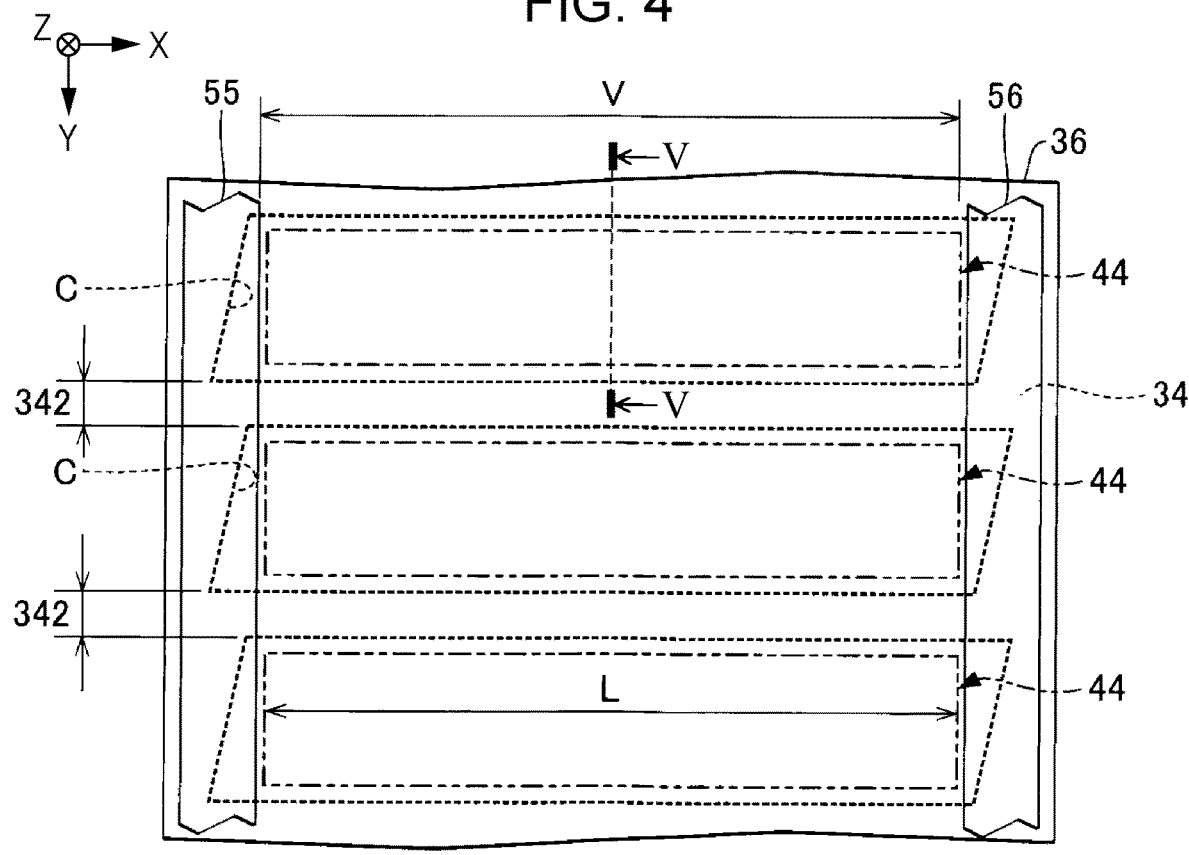
FIG. 4 is a plan view illustrating a diaphragm of the liquid ejecting head according to the embodiment.
Figure 5:
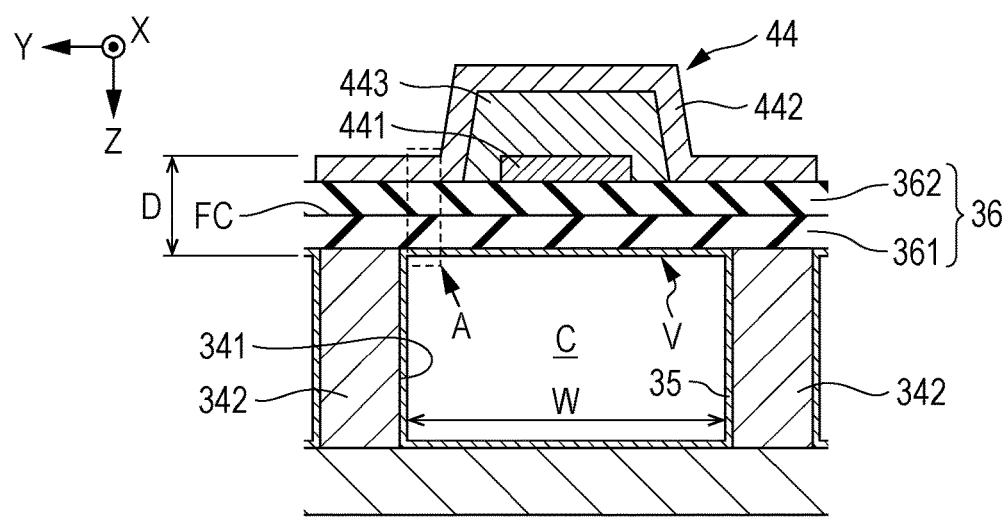
FIG. 5 is a cross-sectional view taken along line V-V in FIG. 4.

FIG. 4 is a plan view illustrating the diaphragm 36 of the liquid ejecting head 26 according to the present embodiment. FIG. 5 is a cross-sectional view taken along line V-V in FIG. 4. As illustrated as an example in FIG. 5, the diaphragm 36 is a layered body including a first layer 361 and a second layer 362. Viewed from the first layer 361, the second layer 362 is located on the side opposite the pressure chamber substrate 34. The first layer 361 is an elastic film formed of an elastic material such as silicon dioxide ($SiO_2$), and the second layer 362 is an insulating film formed of an insulating material such as zirconium dioxide ($ZrO_2$). The first layer 361 and the second layer 362 are each formed by a known film forming technique such as thermal oxidation or sputtering. Note that by selectively removing portions of a plate-shaped member, which has a predetermined plate thickness, in areas corresponding to the pressure chambers C, portions or the entire pressure chamber substrate 34 and the diaphragm 36 can be integrally formed.

As illustrated as an example in FIG. 4, the diaphragm 36, in plan view, includes a plurality of vibrating areas V having shapes corresponding to those of the plurality of pressure chambers C. The vibrating areas V are areas of the diaphragm 36 and are areas vibrated by the piezoelectric elements 44. In other words, the vibrating areas V are areas in the diaphragm 36 that do not come in contact with the pressure chamber substrate 34.

Note that as illustrated as an example in FIG. 5, holes 341 that constitute the pressure chambers C are provided in the pressure chamber substrate 34. Furthermore, a wall-shaped partitioning wall portion 342 that extends in the X direction is provided between each of the two adjacent pressure chambers C, or each of the two adjacent holes 341, in the pressure chamber substrate 34. As described above, in plan view, each pressure chamber C or each hole 341 has a shape elongated in the X direction, which is the second direction. Accordingly, in plan view, each vibrating area V forms a longitudinal shape extending in the X direction. Furthermore, each of the holes 341 is formed, for example, by anisotropic etching a silicon single crystal substrate in which the plate surface is a (110) plane. Accordingly, the shape of each pressure chamber C or vibrating area V in plan view is a shape extending along a (111) plane of the single crystal substrate. Note that the shape of each pressure chamber C or vibrating area V in plan view is not limited to the shape illustrated in the drawing.

A corrosion resistant film 35 that protects the wall surfaces of the pressure chamber C is disposed on the wall surfaces of the pressure chamber C. In the present embodiment, the corrosion resistant film 35 is also disposed on a surface of the diaphragm 36 on the positive side in the Z direction. Resistance of the corrosion resistant film 35 to the ink inside each pressure chamber C is higher than that of the diaphragm 36. A constituent material of the corrosion resistant film 35 may be any material that has resistance to the ink inside the pressure chamber C and is not limited to any material in particular; however, the material includes, for example, silicon oxide such as silicon dioxide ($SiO_2$), metal oxide such as tantalum oxide ($TaO_x$) or zirconium dioxide ($ZrO_2$), or metal such as nickel (Ni) or chrome (Cr). The corrosion resistant film 35 may be formed of a single layer formed of a single material, or may be a layered body including a plurality of layers formed of materials different from each other. A thickness of the corrosion resistant film 35 is not limited to any thickness in particular; however, a film thickness in which there are no shortcomings, such as a pin hole, is desirable, which preferably ranges from 1 nm to 100 nm, inclusive. Note that it is only sufficient that the corrosion resistant film 35 is provided as needed and may be omitted.

As illustrated as an example in FIG. 5, the piezoelectric element 44 are disposed on the surface of the diaphragm 36 on the side opposite the pressure chamber C. Schematically, each piezoelectric element 44 is configured of layers of a first electrode 441, a piezoelectric layer 443, and a second electrode 442. The first electrode 441, the piezoelectric layer 443, and the second electrode 442 are each formed by a known film forming technique such as, for example, sputtering or a sol-gel method, and a known processing technique such as photolithography and etching. The piezoelectric element 44 may be of a type in which electrodes and piezoelectric layers are layered in multiple layers and extend and contract toward the diaphragm 36. Note that another layer, such as a layer that increases the adhesion, may be interposed between the layers of the above multiple layers and between the piezoelectric element 44 and the diaphragm 36 as appropriate.

The first electrode 441 is disposed on the surface of the diaphragm 36, specifically, the first electrode 441 is disposed on a surface of the second layer 362 on the side opposite the first layer 361. The first electrodes 441 are each an individual electrode provided for the corresponding piezoelectric element 44 and are disposed so as to be distanced away from each other. Specifically, the plurality of first electrodes 441 extending in the X direction are arranged in the Y direction at intervals. A drive signal is applied to the first electrode 441 of each piezoelectric element 44 through the drive circuit 50 to eject the ink from the nozzle N corresponding to the above piezoelectric element 44.

The piezoelectric layer 443 is disposed on a surface of the first electrode 441. The piezoelectric layer 443 is formed so as to have a strip-like shape that extends in the Y direction continuously across a plurality of piezoelectric elements 44. While not depicted, through holes that extend in the X direction and that penetrate the piezoelectric layer 443 are provided in the areas of the piezoelectric layer 443 corresponding to the gaps between the pressure chambers C adjacent to each other in plan view. A constituent material of the piezoelectric layer 443 is a piezoelectric material such as, for example, lead zirconate titanate.

The second electrode 442 is disposed on a surface of the piezoelectric layer 443. Specifically, the second electrode 442 is a common electrode having a strip-like shape that extends in the Y direction continuously across the plurality of piezoelectric elements 44. A predetermined reference voltage is applied to the second electrode 442.

A first conductor 55 and a second conductor 56 illustrated as an example in FIG. 4 are formed on a surface of the second electrode 442. The first conductor 55 is a strip-like conductive film that extends in the Y direction along an edge of the second electrode 442 on the negative side in the X direction. The second conductor 56 is a strip-like conductive film that extends in the Y direction along an edge of the second electrode 442 on the positive side in the X direction. The first conductor 55 and the second conductor 56 are formed in the same layer using a low-resistance conductive material such as, for example, gold. By forming the first conductor 55 and the second conductor 56, a voltage drop of the reference voltage in the second electrode 442 is suppressed. Furthermore, the first conductor 55 and the second conductor 56 also function as weights that suppress vibration of the diaphragm 36. Each of the above weights are also referred to as "a weight layer".

As described above, the liquid ejecting head 26 includes the diaphragm 36 that constitutes a portion of the wall surface of each pressure chamber C in which the liquid is stored, and the piezoelectric elements 44 that are each a portion where the piezoelectric layer 443 vibrating the diaphragm 36 is interposed between the first electrode 441 and the second electrode 442. Note that the diaphragm 36 is, as described above, formed of the plurality of layers. Furthermore, each piezoelectric element 44 includes the first electrode 441 disposed on the surface of the diaphragm 36 on the side opposite the pressure chamber C, the piezoelectric layer 443 disposed on the surface of the first electrode 441 on the side opposite the pressure chamber C, and the second electrode 442 disposed on the surface of the piezoelectric layer 443 on the side opposite the pressure chamber C. Furthermore, each piezoelectric element 44 flexes and deforms the diaphragm 36. In the above, in the vibrating area V of the diaphragm 36, cracking is most likely to occur in a portion where the piezoelectric element 44 does not overlap the piezoelectric layer 443 in plan view, in other words, in area A surrounded by a broken line in the diaphragm 36 in FIG. 5. Note that hereinafter, area A of the diaphragm 36 will also be referred to as an "arm portion". The arm portion is a portion of the diaphragm 36 where the piezoelectric element 44 is not provided. Since the piezoelectric layer 443 is not layered in the arm portion, the arm portion is weak in strength. However, in the liquid ejecting head 26, when the entire surface of the diaphragm is covered with the piezoelectric layer, the drive efficiency decreases due to the existence of the piezoelectric layer; accordingly, it is desirable that the arm portion is provided. In each piezoelectric element 44 long in the X direction, desirably, the arm portion is provided on both sides of each piezoelectric element 44 in the Y direction.

Figure 6:
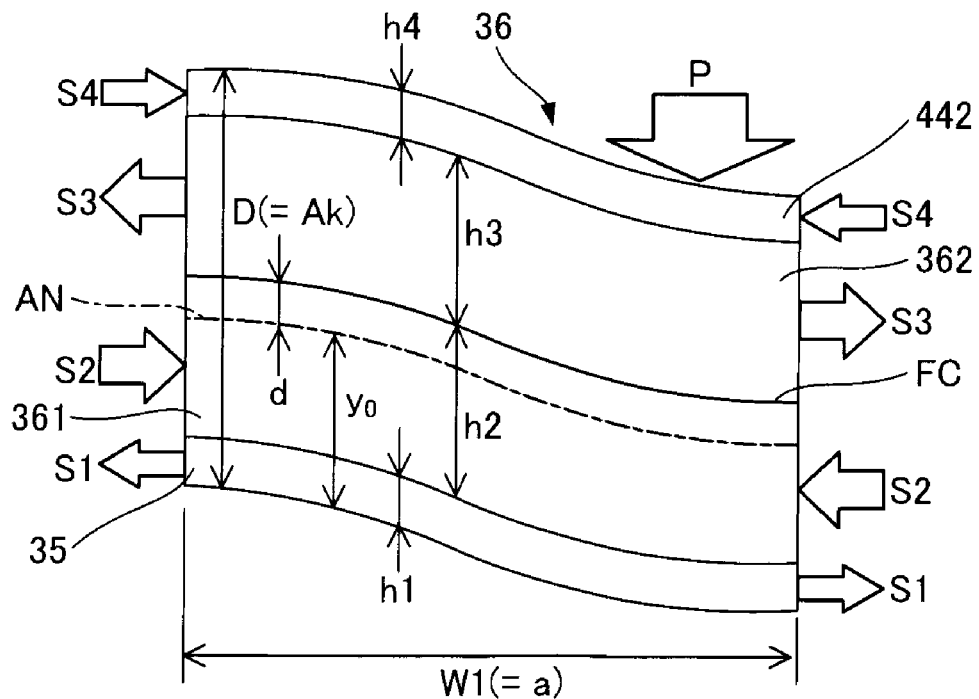
FIG. 6 is a cross-sectional view of a portion of the diaphragm illustrated in an enlarged manner.

FIG. 6 is a cross-sectional view of a portion of the diaphragm 36 illustrated in an enlarged manner. FIG. 6 illustrates area A in FIG. 5 surrounded by the broken line in an enlarged manner. As illustrated as an example in FIG. 6, in the present embodiment, the diaphragm 36 in area A includes the corrosion resistant film 35, the first layer 361, the second layer 362, and the layered body of the second electrode 442 of the piezoelectric element 44. In other words, in area A, the corrosion resistant film 35 and the second electrode 442 also function as a portion of the diaphragm 36.

In the example illustrated in FIG. 6, the first layer 361 is a compressive film having compressive stress S2. The second layer 362 is a tensile film having tensile stress S3. The corrosion resistant film 35 is a tensile film having tensile stress S1. The second electrode 442 is a compressive film having compressive stress S4. Note that thicknesses of the first layer 361 and the second layer 362 are substantially 1 to 50 times, inclusive, or preferably substantially 10 to 50 times, inclusive, the thicknesses of the corrosion resistant film 35 and the second electrode 442. Accordingly, the first layer 361 and the second layer 362 are, among the plurality of layers constituting the diaphragm 36, two adjacent layers having the largest difference in tension. Since distortion occurs in an interface FC between the above layers even when the diaphragm 36 is in a natural state, the existence of the distortion when a voltage is applied to the piezoelectric element 44 tends to be the cause of cracking and the like.

Accordingly, the diaphragm 36 satisfies $$d/D \leq 0.25,$$

where D is a thickness of the diaphragm 36 in area A of the arm portion that is a portion where there is no piezoelectric element 44, and d is a distance between a neutral axis AN of the diaphragm 36 in area A and the interface FC between the first layer 361 and the second layer 362. When d/D, which is a ratio of the distance d to the thickness D, satisfies the above relationship, compared with when the above relationship is not satisfied, the interface FC and the neutral axis AN are closer to each other; accordingly, an occurrence of damage such as cracking in the diaphragm 36 caused by distortion in the interface FC can be reduced.

When a surface of a layered body, which is formed of n number of layers, on the first layer side is used as a reference, a position $y_0$ of the neutral axis AN of the layered body is defined as $$y_0 = \frac{\sum_{k=1}^{n} E_k \int_{A_k} y_z \, dA_k}{\sum_{k=1}^{n} E_k A_k} \tag{1}$$

$$= \frac{\sum_{k=1}^{n} E_k a(h_k^2 + 2h_k h_{k-1} + 2h_k h_{k-2} + \cdots)/2}{\sum_{k=1}^{n} E_k(h_k a)}$$

where k is an integral number from 1 to n, inclusive, $A_k$ is a sectional area of the entire layered body, $E_k$ is a Young's modulus [GPa] of each layer, $h_k$ is a film thickness [nm] of each layer, and a is a width [μm] of the layer.

When the above layered body is applied to the diaphragm 36 in area A, k is 4, the first layer is the corrosion resistant film 35, the second layer is the first layer 361, the third layer is the second layer 362, and the fourth layer is the second electrode 442. Accordingly, the position $y_0$ is a position having the surface of the diaphragm 36 on the corrosion resistant film 35 side as a reference, and position $y_0$ corresponds to the distance between the above reference and the position $y_0$. Note that $E_1$ is the Young's modulus [GPa] of the corrosion resistant film 35, $E_2$ is the Young's modulus [GPa] of the first layer 361, $E_3$ is the Young's modulus [GPa] of the second layer 362, and $E_4$ is the Young's modulus [GPa] of the second electrode 442. Furthermore, $h_1$ is the thickness [nm] of the corrosion resistant film 35, $h_2$ is the thickness [nm] of the first layer 361, $h_3$ is the thickness [nm] of the second layer 362, and $h_4$ is the thickness [nm] of the second electrode 442. The thickness $A_k$ corresponds to, when the sectional area of area A is expressed by "the thickness D of the diaphragm 36×width a", the thickness D. The width a is a width W1 of area A.

Figure 7:
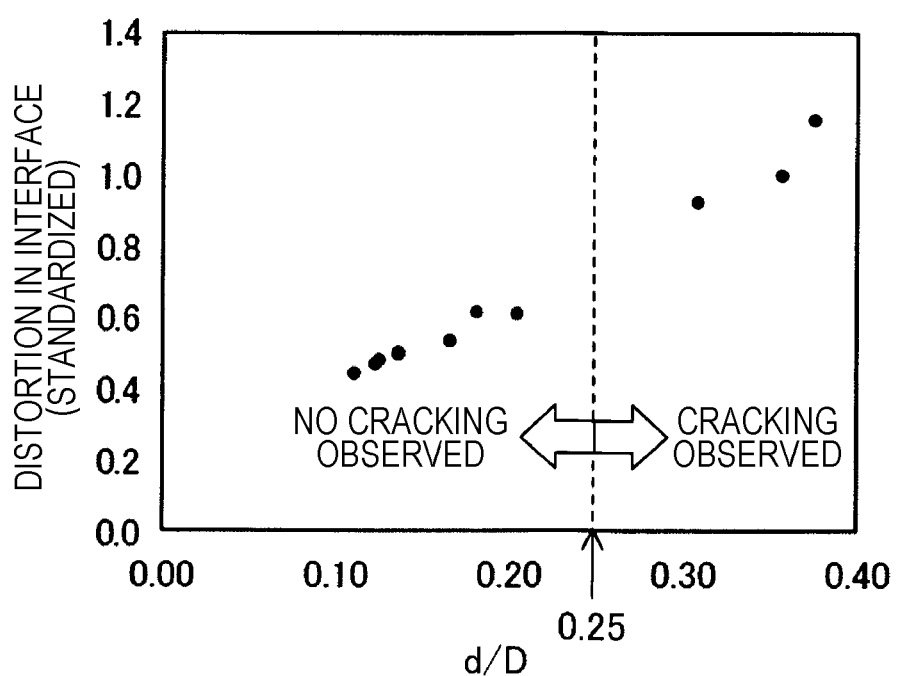
FIG. 7 is a graph illustrating a relationship between d/D, which is a ratio of a distance d to a thickness D, and distortion of an interface in the diaphragm.

FIG. 7 is a graph illustrating a relationship between d/D, which is a ratio of the distance d to the thickness D, and the distortion of the interface FC in the diaphragm 36. The results shown in FIG. 7 is based on the conditions and the evaluations set forth in the following Table 1.

second layer 362. When twice the absolute value of sample No. 1, the relative value is 2. Furthermore, "Cracking" in Table 1 shows the results obtained when each diaphragm was observed when the piezoelectric element was driven under a predetermined condition. Note that in each of the samples in Table 1, the first layer 361 was formed of silicon dioxide, and the second layer 362 was formed of zirconium dioxide. The Young's modulus of the silicon dioxide constituting the first layer 361 was 75 [GPa], and the Young's modulus of the zirconium dioxide constituting the second layer 362 was 190 [GPa]. Although not stated in Table 1, in each of the samples, the corrosion resistant film 35 was formed of tantalum oxide, and the second electrode 442 was formed of layers of iridium and titanium. The thickness of the corrosion resistant film 35 was 30 nm, and the second electrode 442 was formed of a layer of iridium 20 nm thick and a layer of titanium 15 nm thick.

As it is apparent from FIG. 7, there is a tendency in that as the ratio d/D becomes smaller, the distortion in the interface FC in the diaphragm 36 becomes smaller. Furthermore, cracking in the diaphragm occurred in the samples No. 1 to No. 3 that did not satisfy d/D≤0.25, and cracking in the diaphragm did not occur in the samples No. 4 to No. 12 that satisfied d/D≤0.25. As described above, by satisfying d/D≤0.25, an occurrence of damage such as cracking starting from the interface FC in the diaphragm 36 can be reduced.

Note that as described above, in the first layer 361 and the second layer 362, the first layer 361, serving as a first layer, had compressive stress, and the second layer 362, serving as a second layer, had tensile stress. In such a case, compared with when both the first layer 361 and the second layer 362 have compressive stress or tensile stress, the distortion in the interface FC between the first layer 361 and the second layer 362 tends to become large. Accordingly, when one of the layers among the first layer 361 and the second layer 362 has compressive stress and the other layer has tensile stress, it is especially useful that the relationship d/D described above is satisfied in preventing cracking and the like from occurring in the diaphragm 36.

TABLE 1

| | Diaphragm | | | | | Other Conditions | | | | | |
| --- | --- | --- | --- | --- | --- | --- | --- | --- | --- | --- | --- |
| | First Layer: SiO$_2$ | | Second Layer: ZrO$_2$ | | Vibrating | Piezoelectric Element | | | Evaluation | | |
| Sample No. | Thickness h$_2$ [nm] | Film Stress [MPa] | Thickness h$_3$ [nm] | Film Stress [MPa] | Area Width [μm] | First Electrode Width [μm] | Piezoelectric Layer Width [μm] | Active Length L [μm] | Distortion in Interface (Standardized) | d/D | Cracking |
| 1 | 1370 | 220 | 330 | −500 | 70.6 | 42 | 50 | 364 | 1.00 | 0.36 | Observed |
| 2 | 1370 | 220 | 330 | −500 | 73.2 | 44 | 52 | 514 | 1.16 | 0.38 | Observed |
| 3 | 1120 | 220 | 330 | −500 | 61.8 | 38 | 45 | 459 | 0.92 | 0.31 | Observed |
| 4 | 1150 | 220 | 530 | −150 | 70.6 | 42 | 50 | 364 | 0.61 | 0.20 | Not Observed |
| 5 | 910 | 220 | 530 | −150 | 61.8 | 38 | 45 | 459 | 0.50 | 0.14 | Not Observed |
| 6 | 910 | 220 | 550 | −146 | 61.8 | 38 | 45 | 459 | 0.48 | 0.13 | Not Observed |
| 7 | 980 | 220 | 550 | −146 | 61.8 | 38 | 45 | 459 | 0.50 | 0.14 | Not Observed |
| 8 | 980 | 220 | 575 | −140 | 61.8 | 38 | 45 | 459 | 0.47 | 0.12 | Not Observed |
| 9 | 1065 | 220 | 575 | −140 | 70.0 | 42 | 50 | 364 | 0.53 | 0.17 | Not Observed |
| 10 | 1065 | 220 | 575 | −140 | 69.2 | 42 | 50 | 364 | 0.53 | 0.17 | Not Observed |
| 11 | 1065 | 220 | 575 | −140 | 72.3 | 44 | 52 | 514 | 0.62 | 0.18 | Not Observed |
| 12 | 910 | 220 | 575 | −140 | 61.6 | 38 | 45 | 459 | 0.44 | 0.11 | Not Observed |

In FIG. 7 and in Table 1, "Distortion in Interface FC" are standardized relative values in which the absolute value of sample No. 1 is 1 and are simulated distortions that have occurred in the interfaces FC of the samples due to the difference in stress between the first layer 361 and the Furthermore, the second layer 362, which has tensile stress, is adhered to the surface of the first layer 361, which has compressive stress, on the piezoelectric element 44 side. In such a case, even in the natural state in which the diaphragm 36 does not receive any driving force from the piezoelectric elements 44, the diaphragm 36 tends to become flexed and deformed towards the pressure chamber C side and, as a result, the distortion in the interface FC between the first layer 361 and the second layer 362 tends to become large. Accordingly, in the above case, it is especially useful that the relationship d/D described above is satisfied in preventing cracking and the like from occurring in the diaphragm 36.

The constituent material of the first layer 361 may be any material that gives compressive stress to the first layer 361 and is not limited to any material in particular; however, silicon dioxide is desirable as the constituent material. Silicon dioxide is not only suitable for the constituent material of the diaphragm 36, silicon dioxide allows the first layer 361 having compressive stress to be formed easily. For example, when the pressure chamber substrate 34 that forms the pressure chambers C is formed from a silicon substrate, the first layer 361 having compressive stress can be formed by thermally oxidizing the surface of the silicon substrate.

The constituent material of the second layer 362 may be any material that gives tensile stress to the second layer 362 and is not limited to any material in particular; however, zirconium dioxide is desirable as the constituent material. Zirconium dioxide is not only suitable for the constituent material of the diaphragm 36, zirconium dioxide allows the second layer 362 having tensile stress to be formed easily. For example, the second layer 362 having tensile stress can be formed by forming a zirconium layer on the first layer 361 by sputtering or the like and by thermally oxidizing the zirconium layer. Furthermore, the degree of tensile stress in the second layer 362 can be adjusted according to the degree of the above thermal oxidation.

Furthermore, while the width of the diaphragm 36 is not limited to any width in particular, when the width of the diaphragm 36 or the width of the vibrating area V is W, D/W preferably ranges from 0.01 to 0.05, inclusive. By having D/W fall within the range, the diaphragm 36 can be vibrated efficiently with the piezoelectric elements 44. Furthermore, in the diaphragm 36 in which D/W is within the above range, as the pitch of the nozzles becomes smaller and as the width W becomes smaller, the thickness D also becomes smaller; accordingly, cracking and the like tend to occur. In such a case, satisfying the relationship d/D described above is especially useful in preventing the cracking and the like from occurring in the diaphragm 36. On the other hand, when D/W is too small, depending on the constituent material and the like of the diaphragm 36, it is difficult to obtain the required mechanical strength of the diaphragm 36. Conversely, when D/W is too large, the diaphragm 36 does not easily become deformed and the drive efficiency of the liquid ejecting head 26 tends to become lower.

Furthermore, when a is the width of the area A, in other words, when W1 is the width of the diaphragm 36 between the outer edge of the pressure chamber C and the outer edge of the piezoelectric layer 443 in plan view, D/W1 preferably ranges from 0.1 to 0.5, inclusive. By having D/W1 fall within the range, the diaphragm 36 can be vibrated efficiently with the piezoelectric elements 44.

An active length L, which is a length of a portion of the image piezoelectric element 44 in which the first electrode 441, the piezoelectric layer 443, and the second electrode 442 overlap each other in plan view, is not limited to any length in particular; however, as the length increases, cracking and the like tend to occur more easily in the diaphragm 36. In particular, when the active length L exceeds 514 μm, the above tendency increases. Accordingly, when the active length L exceeds 514 μm, satisfying the relationship d/D described above is especially useful in preventing the cracking and the like from occurring in the diaphragm 36.

As described above, the liquid ejecting head 26 of the present embodiment includes the pressure chamber substrate 34 in which the pressure chambers C are formed, and the wiring substrate 46 that is adhered to the pressure chamber substrate 34 through the conductive bumps T. Accordingly, even when the pitches of the terminals of the drive circuit 50 that drives the plurality of piezoelectric elements 44 and the pitches of the terminals of the pressure chamber substrate 34 are different, the terminals can be coupled to each other through the wiring substrate 46. Accordingly, the pitches of the nozzles N can be narrowed easily. Note that when the pitches of the nozzles N are narrowed, the width of the diaphragm 36 will be narrowed and, consequently, thinning of the diaphragm 36 will be required. Accordingly, when the pitches of the nozzles N and narrowed, cracking and the like tend to occur in the diaphragm 36. Accordingly, in such a case, satisfying the relationship d/D described above is especially useful in preventing the cracking and the like from occurring in the diaphragm 36.

Furthermore, as described above, while the flow path substrate 32 and the pressure chamber substrate 34 of the liquid ejecting head 26 are coupled to each other using an adhesive agent, it is desirable that the adhesive agent is not disposed in the corner portions formed when coupling the pressure chambers C and the diaphragm 36 to each other. In the above case, the occurrence of cracking and the like in the diaphragm 36 caused by the stress of the adhesive agent can be reduced.

Furthermore, by using the technique disclosed in JP-A-2018-99779, drive signals including a discharge drive waveform and a non-discharge drive waveform may be applied to each piezoelectric element 44. Note that the discharge drive waveform is a waveform that drives the piezoelectric element 44 to discharge the liquid from the nozzle N. The non-discharge drive waveform is a waveform that drives the piezoelectric element 44 to a degree at which the liquid is not discharged from the nozzle N. Compared to when the discharge drive waveform alone is used without using the non-discharge drive waveform, when both the discharge drive waveform and the non-discharge drive waveform are used, the frequency in which the diaphragm 36 is deformed becomes higher. Accordingly, when both the discharge drive waveform and the non-discharge drive waveform are used, satisfying the relationship d/D described above is especially useful in preventing the cracking and the like from occurring in the diaphragm 36.

2. Modifications

Each of the configurations illustrated above as examples can be modified in various ways. Specific modification modes that can be applied to the embodiments described above will be described below as examples. Note that two or more optionally selected modes from the examples below can be merged as appropriate as long as they do not contradict each other.

2-1. First Modification

Figure 8:
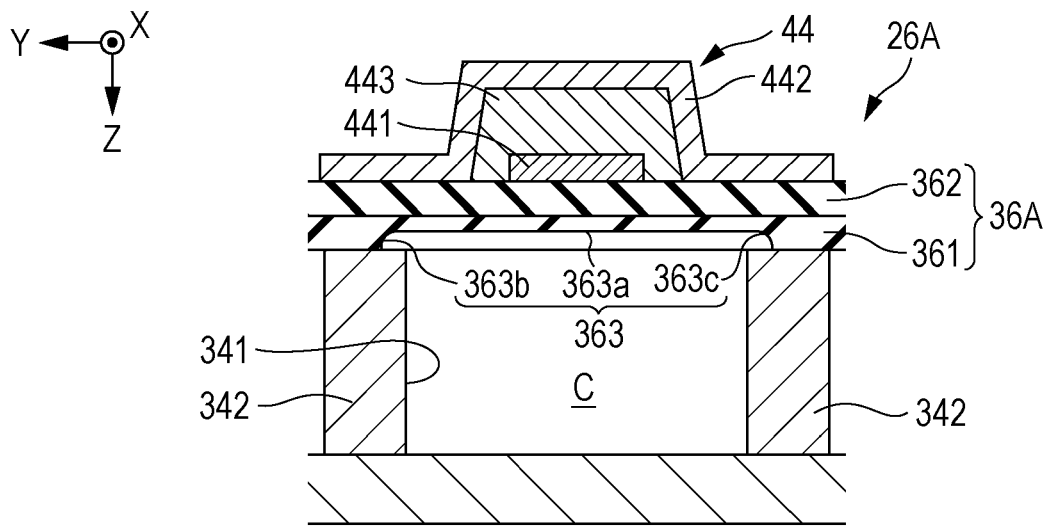
FIG. 8 is a cross-sectional view of a liquid ejecting head according to a first modification.

FIG. 8 is a cross-sectional view of a liquid ejecting head 26A according to a first modification. In the liquid ejecting head 26A, recessed portions 363 are provided in the surface of the diaphragm 36 on the pressure chamber C side. In plan view, each recessed portion 363 includes the corresponding pressure chamber C. Furthermore, a surface 363c that connects a bottom surface 363a and a lateral surface 363b of each recessed portion 363 is a curved surface. Accordingly, the occurrence of cracking and the like caused by concentration of stress when the diaphragm 36 is flexed and deformed can be reduced. Note that the recessed portions 363 are formed, for example, by overetching the diaphragm 36 when the pressure chambers C are formed by etching. A depth of the recessed portion 363 and a radius of curvature of the surface 363c each range, for example, from 50 nm to 1000 nm, inclusive. Furthermore, the radius of curvature of the surface 363c is preferably 0.5 to 1 times, inclusive, the depth of the recessed portion 363. Furthermore, while the corrosion resistant film 35 is omitted in FIG. 8, the corrosion resistant film 35 can be provided.

2-2. Second Modification

Figure 9:
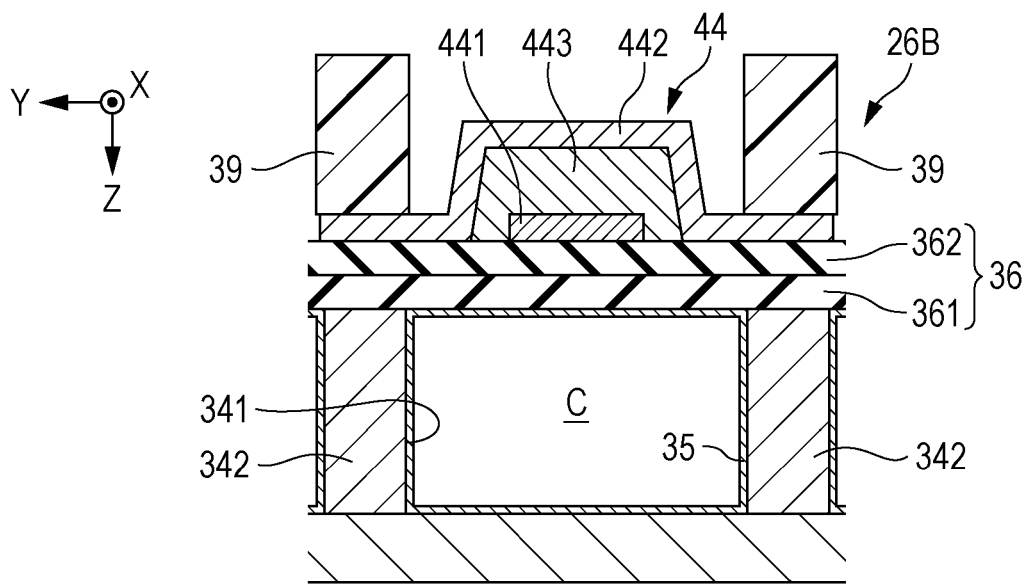
FIG. 9 is a cross-sectional view of a liquid ejecting head according to a second modification.

FIG. 9 is a cross-sectional view of a liquid ejecting head 26B according to a second modification. In the liquid ejecting head 26B, resin layers 39 formed of resin are disposed on a surface of the diaphragm 36 on a side opposite the pressure chambers C. In plan view, the resin layers 39 are adhered to the diaphragm 36 at positions corresponding to the partitioning wall portions 342. As described above, the liquid ejecting head 26B includes the partitioning wall portions 342 that are partitioning walls that partition the pressure chambers C, and the resin layers 39 that are adhered to the partitioning wall portions 342 with the diaphragm 36 in between. With the above configuration, the occurrence of cracking and the like caused by concentration of stress when the diaphragm 36 is flexed and deformed can be reduced.

2-3. Third Modification

Figure 10:
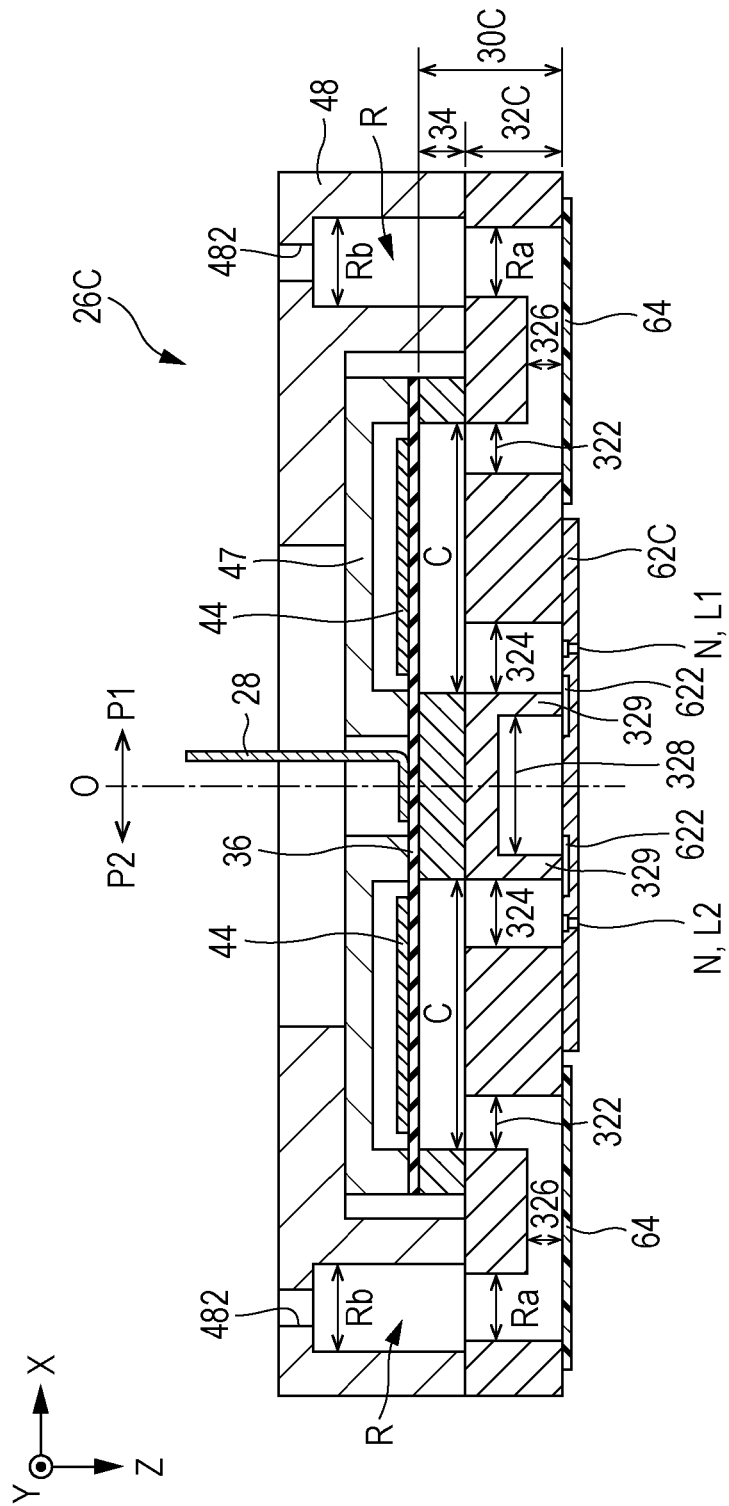
FIG. 10 is a cross-sectional view of a liquid ejecting head according to a third modification.

FIG. 10 is a cross-sectional view of a liquid ejecting head 26C according to a third modification. The liquid ejecting head 26C is similar to the liquid ejecting head 26 of the embodiment described above except that the liquid ejecting head 26C does not use the wiring substrate 46 and is configured to circulate the ink. As illustrated as an example in FIG. 10, the liquid ejecting head 26C includes a flow path forming unit 30C. The flow path forming unit 30C is constituted by layers including a flow path substrate 32C and the pressure chamber substrate 34. The diaphragm 36, a plurality of piezoelectric elements 44, a protective member 47, and the housing portion 48 are mounted in an area on the negative side in the Z direction with respect to the flow path forming unit 30C. On the other hand, a nozzle plate 62C and the vibration absorber 64 are mounted in an area on the positive side in the Z direction with respect to the flow path forming unit 30C. Note that in the liquid ejecting head 26C, configurations of two portions, namely, a first portion P1 on the positive side in the X direction and a second portion P2 on the negative side in the X direction with a center plane O in between, are substantially the same.

The protective member 47 is a plate-shaped member that protects the plurality of piezoelectric elements 44 and is mounted on the surface of the diaphragm 36. While the material and the manufacturing method of the protective member 47 are optional, similar to the flow path substrate 32C and the pressure chamber substrate 34, the protective member 47 can be formed by processing a single crystal substrate formed of silicon (Si) using a semiconductor manufacturing technique, for example. The plurality of piezoelectric elements 44 are accommodated in the recessed portions formed in a surface of the protective member 47 on the diaphragm 36 side.

An end portion of a wiring substrate 28 is adhered to the surface of the diaphragm 36 on the side opposite the flow path forming unit 30C. The wiring substrate 28 is a flexible surface mounted component in which a plurality of wires (not shown) that electrically couple the control unit 20 and the liquid ejecting head 26c are formed. An end portion of the wiring substrate 28 extended to an external portion after the wiring substrate 28 has been passed through an opening portion formed in the protective member 47 and through an opening portion formed in the housing portion 48 is coupled to the control unit 20. The flexible wiring substrate 28 such as, for example, a flexible printed circuit (FPC) or a flexible flat cable (FFC) is desirably used.

As illustrated as an example in FIG. 10, a circulation liquid chamber 328 is formed in a surface of the flow path substrate 32C opposing the nozzle plate 62C. The circulation liquid chamber 328 in plan view is an elongated bottomed hole (a groove portion) extending in the Y direction. An opening of the circulation liquid chamber 328 is closed by the nozzle plate 62C adhered to the surface of the flow path substrate 32C.

As illustrated as an example in FIG. 10, a plurality of circulation flow paths 622 for each of the first portion P1 and the second portion P2 are formed in a surface of the nozzle plate 62C opposing the flow path forming unit 30. The plurality of circulation flow paths 622 of the first portion P1 corresponds to the plurality of nozzles N of the first line L1 on a one-to-one basis. Furthermore, the plurality of circulation flow paths 622 of the second portion P2 corresponds to the plurality of nozzles N of the second line L2 on a one-to-one basis.

Figure 11:
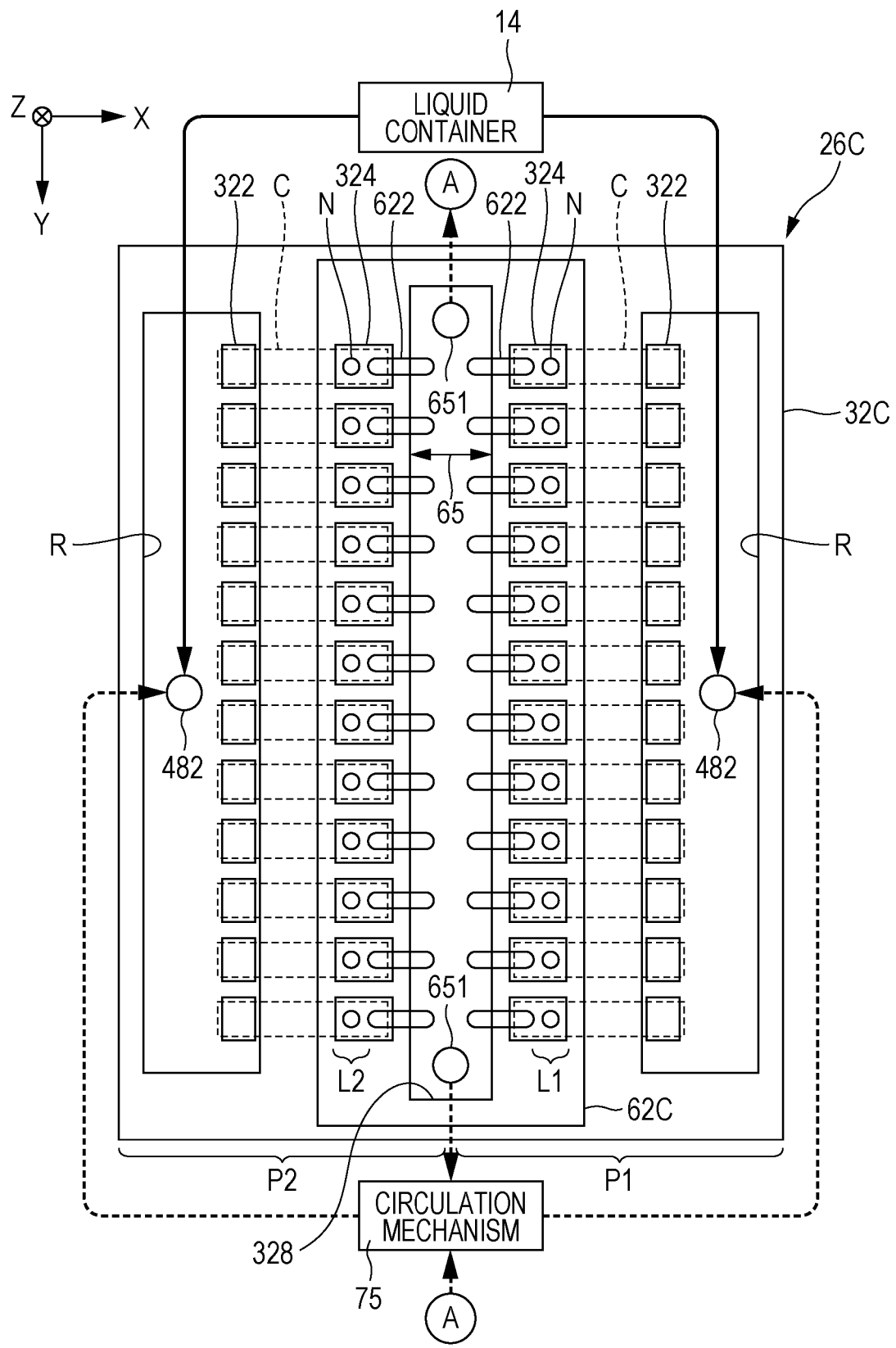
FIG. 11 is a schematic diagram illustrating a circulation of ink in the liquid ejecting head in FIG. 10.

FIG. 11 is a schematic diagram illustrating a circulation of the ink in the liquid ejecting head 26C in FIG. 10. As illustrated as an example in FIG. 11, the circulation liquid chamber 328 continues along the first line L1 and the second line L2 and across the plurality of nozzles N. Specifically, the circulation liquid chamber 328 is formed between an array of the plurality of nozzles N of the first line L1 and an array of the plurality of nozzles N of the second line L2. Accordingly, as illustrated as an example in FIG. 11, the circulation liquid chamber 328 is positioned between the communication flow paths 324 of the first portion P1 and the communication flow paths 324 of the second portion P2. As it can be understood from the above description, the flow path forming unit 30C of the third modification is a structure in which the pressure chambers C and the communication flow paths 324 in the first portion P1, the pressure chambers C and the communication flow paths 324 in the second portion P2, and the circulation liquid chamber 328 positioned between the communication flow paths 324 of the first portion P1 and the communication flow paths 324 of the second portion P2 are formed. As illustrated as an example in FIG. 10, the flow path forming unit 30C of the third modification includes partitioning wall portions 329 that are wall shaped portions that partition between the circulation liquid chamber 328 and the communication flow paths 324.

As illustrated as an example in FIG. 11, a circulation mechanism 75 is coupled to the liquid ejecting head 26C. The circulation mechanism 75 is a mechanism that supplies and circulates the ink inside the circulation liquid chamber 328 to the liquid storage chambers R. More specifically, the circulation mechanism 75 suctions the ink through the discharge ports 651 provided at both end portions of the circulation liquid chamber 328 in the Y direction, and supplies the ink to the introduction openings 482 after a predetermined process such as removing foreign matters from the ink has been performed on the suctioned ink. As it can be understood from the above description, the ink circulates through the following route in the third modification: the liquid storage chambers R→the supply flow paths 322→the pressure chambers C→the communication flow paths 324→the circulation flow paths 622→the circulation liquid chamber 328→the circulation mechanism 75→the liquid storage chambers R.

As described above, the liquid ejecting head 26C includes the introduction openings 482 and the discharge ports 651 that are coupled to the circulation mechanism 75 that circulates the liquid through the pressure chambers C. Accordingly, compared with a case in which the circulation mechanism 75 is not used, the fluctuation in the temperature of the liquid inside the pressure chambers C can be reduced. As a result, the occurrence of cracking and the like in the diaphragm 36 caused by changes in temperature can be reduced.

2-4. Others (1) In the embodiments described above, an example in which the diaphragm includes arm portions have been illustrated; however not limited to the above, the present disclosure can be applied to a diaphragm that does not include any arm portions. For example, the piezoelectric elements may, without being adhered to the diaphragm, be abutted against the diaphragm.

(2) In the embodiment described above, a configuration in which the first electrodes 441 are individual electrodes, and the second electrode 442 is a common electrode has been illustrated as an example; however, the first electrode 441 may be a common electrode continuing across a plurality of piezoelectric elements 44, and the second electrode 442 may be individual electrodes each for a piezoelectric element 44. Alternatively, both the first electrodes 441 and the second electrodes 442 may be individual electrodes.

(3) While in the embodiments described above, the serial type liquid ejecting apparatus 100 in which the transport body 242 in which the liquid ejecting head 26 is mounted is reciprocated has been described as an example, a line type liquid ejecting apparatus in which a plurality of nozzles N are distributed across the entire width of the medium 12 can also be applied to the present disclosure.

(4) The liquid ejecting apparatus 100 described as an example in the embodiments described above may be employed in various apparatuses other than an apparatus dedicated to printing, such as a facsimile machine and a copier. Note that the application of the liquid ejecting apparatus of the present disclosure is not limited to printing. For example, a liquid ejecting apparatus that ejects a coloring material solution is used as a manufacturing apparatus that forms a color filter of a liquid crystal display. Furthermore, a liquid ejecting apparatus that ejects a conductive material solution is used as a manufacturing apparatus that forms wiring and electrodes of a wiring substrate.

What is claimed is:

1. A liquid ejecting head comprising:
a diaphragm constituting a portion of a wall surface of a pressure chamber that accommodates a liquid; and
a piezoelectric element that vibrates the diaphragm, wherein
the piezoelectric element is provided so as to cover only a portion of the diaphragm opposing the pressure chamber, the piezoelectric element includes,
a first electrode disposed on a surface of the diaphragm on a side opposite the pressure chamber,
a piezoelectric layer disposed on a surface of the first electrode on a side opposite the pressure chamber, and
a second electrode disposed on a surface of the piezoelectric layer on a side opposite the pressure chamber,
the diaphragm includes a plurality of layers, and $d/D \leq 0.25$, is satisfied where D is a thickness of the diaphragm and d is a distance between a neutral axis of the diaphragm and an interface between two adjacent layers in which a tension difference is the largest in the plurality of layers, and D/W1 ranges from 0.1 to 0.5, inclusive, where W1 is a width of the diaphragm between an outer edge of the pressure chamber and an outer edge of the piezoelectric layer in a plan view.

2. The liquid ejecting head according to claim 1, wherein in the two adjacent layers, a first layer has compressive stress and a second layer has tensile stress.

3. The liquid ejecting head according to claim 2, wherein the second layer is adhered to a surface of the first layer on a piezoelectric element side.

4. The liquid ejecting head according to claim 2, wherein a constituent material of the first layer is silicon dioxide.

5. The liquid ejecting head according to claim 2, wherein a constituent material of the second layer is zirconium dioxide.

6. The liquid ejecting head according to claim 1, wherein the piezoelectric element includes,
a first electrode disposed on a surface of the diaphragm on a side opposite the pressure chamber,
a piezoelectric layer disposed on a surface of the first electrode on a side opposite the pressure chamber, and
a second electrode disposed on a surface of the piezoelectric layer on a side opposite the pressure chamber, and
the diaphragm includes an area that is inside an outer edge of the pressure chamber and that does not overlap the piezoelectric layer in the plan view.

7. The liquid ejecting head according to claim 1, wherein a plurality of the piezoelectric elements are disposed in a first direction, and each piezoelectric element has a longitudinal shape extending in a second direction, the second direction being orthogonal to a thickness direction of the diaphragm and to the first direction.

8. The liquid ejecting head according to claim 1, wherein D/W ranges from 0.01 to 0.05, inclusive, where W is a width of the diaphragm.

9. The liquid ejecting head according to claim 1, wherein a length of a portion of the piezoelectric element where the first electrode, the piezoelectric layer, and the second electrode overlap each other in the plan view exceeds 514 μm.

10. The liquid ejecting head according to claim 1, further comprising:
a pressure chamber substrate in which the pressure chamber is formed; and
a wiring substrate adhered to the pressure chamber substrate through a conductive bump.

11. The liquid ejecting head according to claim 1, further comprising:
an introduction opening and a discharge port coupled to a circulation mechanism that circulates the liquid through the pressure chamber.

12. The liquid ejecting head according to claim 1, wherein an adhesive agent is not disposed in a corner portion formed by coupling the pressure chamber and the diaphragm to each other.

13. The liquid ejecting head according to claim 1, further comprising:

a recessed portion provided in a surface of the diaphragm on a pressure chamber side, the recessed portion including the pressure chamber in the plan view, wherein a surface connecting a bottom surface and a lateral surface of the recessed portion is a curved surface.

14. The liquid ejecting head according to claim 1, further comprising:

a partition wall that partitions a plurality of the pressure chambers; and a resin layer that is adhered to the partition wall with the diaphragm in between.

15. The liquid ejecting head according to claim 1, wherein a drive signal including a discharge drive waveform and a drive signal including a non-discharge drive waveform are applied to the piezoelectric element, the discharge drive waveform driving the piezoelectric element so that the liquid is discharged from the nozzle, and the non-discharge drive waveform driving the piezoelectric element to a degree at which the liquid is not discharged from the nozzle.

16. A liquid ejecting apparatus comprising:

the liquid ejecting head according to claim 1.

* * * * *